(12) United States Patent
Hong et al.

(10) Patent No.: US 8,885,403 B2
(45) Date of Patent: Nov. 11, 2014

(54) PROGRAMMING A SPLIT GATE BIT CELL

(71) Applicants: Cheong M. Hong, Austin, TX (US);
Ronald J. Syzdek, Austin, TX (US);
Brian A. Winstead, Austin, TX (US)

(72) Inventors: Cheong M. Hong, Austin, TX (US);
Ronald J. Syzdek, Austin, TX (US);
Brian A. Winstead, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 11 days.

(21) Appl. No.: 13/751,548

(22) Filed: Jan. 28, 2013

(65) Prior Publication Data

US 2014/0211559 A1    Jul. 31, 2014

(51) Int. Cl.
*G11C 11/34* (2006.01)
*G11C 11/40* (2006.01)

(52) U.S. Cl.
CPC ...................................... *G11C 11/40* (2013.01)
USPC ........................................................ 365/182

(58) Field of Classification Search
CPC ........ G11C 16/06; G11C 11/34; G11C 16/10;
G11C 16/0425; G11C 16/0475; G11C 16/12;
G11C 16/3486; G11C 5/147; G11C 16/0458
USPC ................ 365/185.03, 185.12, 185.1, 185.14
See application file for complete search history.

(56) References Cited

U.S. PATENT DOCUMENTS 7,236,398 B1 * 6/2007 Smolen et al. ........... 365/185.14
2012/0261769 A1   10/2012 Hong et al.

OTHER PUBLICATIONS

U.S. Appl. No. 13/451,876, filed Apr. 20, 2012.
U.S. Appl. No. 13/633,124, filed Oct. 1, 2012.

* cited by examiner

*Primary Examiner* — Thong Q Le
(74) *Attorney, Agent, or Firm* — Joanna G. Chiu; James L. Clingan, Jr.

(57) ABSTRACT

A method of programming a split gate memory applies voltages differently to the terminals of the selected cells and the deselected cells. For cells being programming by being coupled to a selected row and a selected column, coupling the control gate to a first voltage, coupling the select gate to a second voltage, programming is achieved by coupling the drain terminal to a current sink that causes the split gate memory cell to be conductive, and coupling the source terminal to a third voltage. For cells not being programmed by not being coupled to a selected row, non-programming is maintained by coupling the control gate to the first voltage, coupling the select gate to a fourth voltage which is greater than a voltage applied to the select gate during a read in which the split gate memory cells are deselected but sufficiently low to prevent programming.

20 Claims, 3 Drawing Sheets

| MEMORY CELL POSITION | | CG | SG | BL | SRC |
|---|---|---|---|---|---|
| SELECTED SECTOR (SECTOR 0) | SR SC (BITCELL 26) | 9V (CG0) | 1.0V (WL00) | 0.3V (BL0) | 5V (SRC0) |
| | SR UC (BITCELL 28) | 9V (CG0) | 1.0V (WL00) | 1.25V (BL1) | 5V (SRC0) |
| | UR SC (BITCELL 30) | 9V (CG0) | 0.2V (WL01) | 0.3V (BL0) | 5V (SRC0) |
| | UR UC (BITCELL 32) | 9V (CG0) | 0.2V (WL01) | 1.25V (BL1) | 5V (SRC0) |
| UNSELECTED SECTOR (SECTOR 1) | UR SC (BITCELL 34) | 1.5V (CG1) | 0.2V (WL10) | 0.3V (BL0) | 0.2V (SRC1) |
| | UR UC (BITCELL 36) | 1.5V (CG1) | 0.2V (WL10) | 1.25V (BL1) | 0.2V (SRC1) |

PROGRAMMING A SPLIT GATE BIT CELL

BACKGROUND

1. Field

This disclosure relates generally to memories, and more specifically, to programming split gate bit cell.

2. Related Art

Split gate non-volatile memories (NVMs) including, for example, split gate flash devices, provide advantages over stacked-gated devices. Split gate flash cells exhibit reduced program disturb for memory cells that are unselected but are either on the selected row or, in the alternative, on the selected column. Normally, cells on the selected row or the selected column are the most likely to exhibit disturb effects regardless of the operation that is being performed on a selected cell. While split gate flash cells have substantially reduced the program disturb problem for cells on the selected rows or columns, the program disturb of erased bits on cells of unselected rows/unselected columns are the primary disturb mechanism. One of the reasons that these cells are susceptible in split gate designs is that the particular stress applied to unselected cells is applied for many more cycles than the stress that is applied to cells on a selected row/unselected column or an unselected row/selected column.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

During programming of a selected split gate memory cell in a split gate NVM, applied biases of unselected erased bits may result in one or more unselected erased bits being inadvertently programmed. Program disturb is typically caused by band to band carrier generation and source to drain leakage current which may result in electrons getting inadvertently injected into unselected erased bits of the split gate NVM. As technology advances and the thickness of the select gate oxides of the split gate memory cells decreases, the band to band carrier generation becomes a more dominant source of program disturb. Therefore, in one embodiment, in order to reduce program disturb, the bias voltage applied to the select gate (e.g. word line) of memory cells on unselected rows of the memory is set to a particular select gate bias voltage which reduces the band to band carrier generation. In one embodiment, this select gate bias voltage is a voltage which is greater than a voltage applied to the select gate of deselected split gate memory cells during a read operation. This select gate bias voltage applied to memory cells on unselected rows during programming reduces band bending in the gap regions of these split gate memory cells. The band bending is reduced as there is a reduction in the potential difference between the select gate and control gate, and between the select gate and the source. The reduction in band bending reduces the electron/hole pairs generated in the gap regions which reduces injection of electrons into the memory cells on unselected rows. In this manner, program disturb may be reduced.

Figure 1:
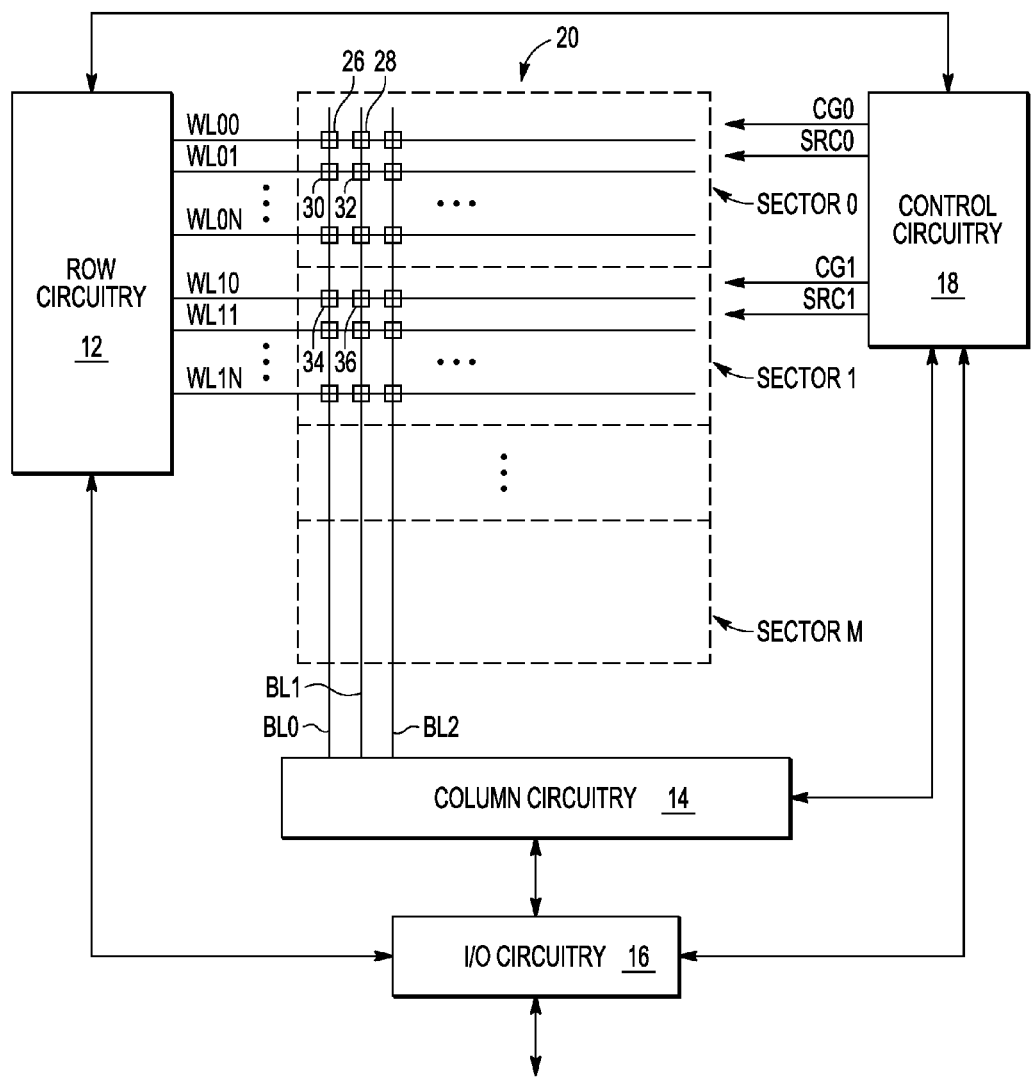
FIG. 1 illustrates, in block diagram form, a memory system having a memory array in accordance with one embodiment of the present disclosure.

FIG. 1 illustrates, in block diagram form, a memory system 10 in accordance with one embodiment of the present disclosure. Memory system 10 includes a split gate memory cell array 20 which includes a plurality of memory cells, such as memory cells 26, 28, 30, 32, 34, and 36. Array 20 may be partitioned into any number of sectors. In the illustrated embodiment, array 20 includes M+1 sectors, such as sector 0, sector 1, ..., sector M. Memory 10 also includes row circuitry 12, column circuitry 14, control circuitry 18, and I/O circuitry 16. Control circuitry 18 is coupled to each of row circuitry 12 and column circuitry 14, and column circuitry 14 is coupled to I/O circuitry 16. I/O circuitry 16 is also coupled to row circuitry 12 and control circuitry 18. Array 20 includes any number of bit lines, including BL0, BL1, BL2, etc. Each of these bit lines is coupled to column circuitry 14 which may includes the appropriate sensing and writing circuitry to read/write to the bit cells of array 20. Each sector of array 20 includes any number of word lines. For example, sector 0 includes N+1 word lines: WL00, WL01, ..., WL0N, and sector 1 includes N+1 word lines: WL10, WL11, ..., WL1N. Each of these word lines is coupled to row circuitry 12. A memory cell is coupled to the intersection of each word line and bit line. In the illustrated embodiment, memory cell 26 is coupled to WL00 and BL0 and is in sector 0, memory cell 28 is coupled to WL00 and BL1 and is in sector 0, memory cell 30 is coupled to WL01 and BL0 and is in sector 0, memory cell 32 is coupled to WL01 and BL1 and is in sector 0, memory cell 34 is coupled to WL10 and BL0 and is in sector 1 and memory cell 36 is coupled to WL10 and BL1 and is in sector 1. Note that each word line may be referred to as a row and each bit line as a column of array 20. As will be described in further detail below, row circuitry 12 provides the appropriate voltage values to each of the word lines, in which the word lines are coupled to the select gates of each memory cell. I/O circuitry 16 communicates with row circuitry 12, column circuitry 14, and control circuitry 18 as needed to read and write array 20. Control circuitry 18 also provides the appropriate voltage values for the control gates and the source terminals of each memory cell of array 20. For example, the control gate of each memory cell of sector 0 is coupled to receive control gate voltage CG0, the source terminal of each memory cell of sector 0 is coupled to receive source terminal voltage SRC0, the control gate of each memory cell of sector 1 is coupled to receive control gate voltage CG1, and the source terminal of each memory cell of sector 1 is coupled to receive source terminal voltage SRC1. In the illustrated embodiment, each memory cell within a sector receives the same control gate voltage and the same source terminal voltage. That is, in the illustrated embodiment, note that, within each sector, the control gate voltage (e.g. CG0, CG1, etc.) is a common voltage node and the source terminal voltage (e.g. SRC0, SRC1, etc.) is a common voltage node.

Figures 2, 3:
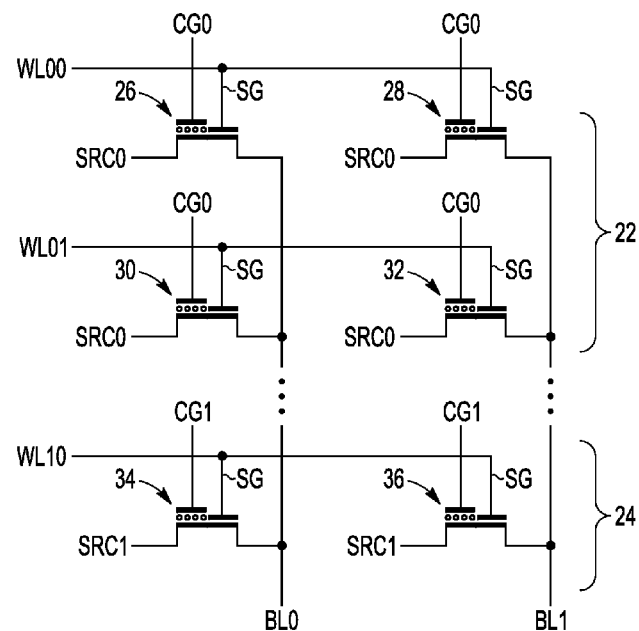
FIG. 2 illustrates, in schematic form, a portion of the memory array of FIG. 1 in further detail, in accordance with one embodiment of the present disclosure.
FIG. 3 illustrates, in table form, example program voltages applied to various bit cells of the array of FIG. 1 during programming of the memory system.

FIG. 2 illustrates a portion of array 20 in further detail. FIG. 2 illustrates memory cells 26, 28, 30, 32, 34, and 36. Memory cell 26 has a control gate coupled to receive CG0, a select gate coupled to WL00, a source terminal coupled to receive SRC0, and a drain terminal coupled to BL0. Memory cell 28 has a control gate coupled to receive CG0, a select gate coupled to WL00, a source terminal coupled to receive SRC0, and a drain terminal coupled to BL1. Memory cell 30 has a control gate coupled to receive CG0, a select gate coupled to WL01, a source terminal coupled to receive SRC0, and a drain terminal coupled to BL0. Memory cell 32 has a control gate coupled to receive CG0, a select gate coupled to WL01, a source terminal coupled to receive SRC0, and a drain terminal coupled to BL1. Memory cell 34 has a control gate coupled to receive CG1, a select gate coupled to WL10, a source terminal coupled to receive SRC1, and a drain terminal coupled to BL0. Memory cell 36 has a control gate coupled to receive CG1, a select gate coupled to WL10, a source terminal coupled to receive SRC1, and a drain terminal coupled to BL1.

During a program operation, a particular memory cell of array 20 is selected for programming by an access address and data corresponding to an access request. Row circuitry 12 activates a selected word line corresponding to the access address and column circuitry 14 couples a current sink to the selected bit line corresponding to the access address, which causes the selected memory cell to be conductive. In the illustrated embodiment, it will be assumed that for a program operation, memory cell 26 is selected for programming, and memory cells 28, 30, 32, 34, and 36 are unselected. In this case, sector 0 is selected since the selected word line is in sector 0, and all other sectors, including sector 1, are deselected. If memory cell 26 is selected, WL00 is activated, and a current sink within column circuitry 14 is coupled to the selected bit line, BL0.

FIG. 3 illustrates, in table form, the voltage values which may be applied to each memory cell during a program operation. The first column of the table refers to the memory cell position. For each memory cell position, the first pair of letters indicates if the memory cell is coupled to the selected row (SR) or to an unselected row (UR), and the second pair of letters indicates if the memory cell is coupled to the selected column (SC) or an unselected column (UC). Furthermore, the first four rows of the table correspond to the different memory cell positions of a selected sector (i.e. the sector in which the selected memory cell for programming is located). Therefore, each memory cell of a selected sector is one of four positions: SR SC, SR UC, UR SC, and UR UC. For example, referring to FIG. 2 in which it is assumed that memory cell 26 is selected for programming, memory cell 26 is a memory cell that is coupled to a selected row and a selected column and thus is in the SR SC position, memory cell 28 is coupled to a selected row and unselected column and thus is in the SR UC position, memory cell 30 is coupled to an unselected row and selected column and thus is in the UR SC position, and memory cell 32 is coupled to an unselected row and unselected column and thus is in the UR UC position. Note that all memory cells in sector 0 coupled to WL00 (and not to BL0) would be considered to be in the SR UC position, all memory cells in sector 0 coupled to BL0 (and not to WL00) would be considered in the UR SC position, and all memory cells in sector 0 which are not coupled to either WL00 or BL0 would be considered in the UR UC position. Referring back to FIG. 3, the second two rows of the table correspond to the different memory cell positions of an unselected (i.e. deselected) sector (i.e. any sector which does not contain the selected memory cell). Therefore, each memory cell of an unselected sector is in one of the following two positions: UR SC and UR UC. For example, referring to FIG. 2 in which it is assumed that memory cell 26 is selected for programming, memory cells 34 is a memory cell coupled to an unselected row and a selected column and thus is in the UR SC position, and memory cell 36 is a memory cell coupled to an unselected row and an unselected column and thus is in the UR UC position. Note that all memory cells in any sector other than sector 0 which are coupled to BL0 would be considered in the UR SC position, and all memory cells in any sector other than sector 0 which are not coupled to BL0 would be considered in the UR UC position.

During programming of selected memory cell 26, source side injection is used to store electrons into the charge storage layer of the memory cell. This is done by flowing a current between the drain and source terminals and applying a high voltage onto the control gate in order to inject electrons from the flowing current into the charge storage layer. This charge storage layer may include nanocrystals for storing the electrons. Therefore, in accordance to the table of FIG. 3, to program selected memory cell 26, a voltage of 9V can be applied to the control gate (CG0), a voltage of 1.0V can be applied to the select gate (WL00), BL0 can be coupled to a current sink which may result in a sink voltage on the drain terminal of about 0.3V, and a voltage of 5V can be applied to the source terminal (SRC0). In this case, the voltage on the source terminal, SRC0, of memory cell 26 and the coupling of BL0 to a current sink results in memory cell 26 being conductive such that current flows from the source terminal to BL0, and the high voltage applied to the control gate results in the injection of electrons into memory cell 26. Therefore, note that during a program operation, the drain terminal of a selected memory cell functions as a source while the source terminal functions as a drain. However, during a read operation (performed as known in the art), the drain terminal functions as a drain and the source terminal functions as a source.

Note that for the selected sector, the same voltage value (e.g. 9V) is applied to the control gates of all memory cells in the selected sector and the same voltage value (e.g. 5V) is applied to the source terminals of all memory cells in the selected sector. For the memory cells coupled to unselected columns, the drain terminals of the memory cells are coupled to a voltage (by way of the corresponding bit line) that is greater than the voltage applied to the select gate. In the example of FIG. 3, this voltage may be 1.25V. Also, for a memory cells coupled to an unselected row and unselected column, the drain terminals of the memory cells (by way of the corresponding bit line) may also be coupled to a voltage that is greater than the voltage applied to the select gate, such as, for example, 1.25V. Note that for memory cells coupled to a selected column, the drain terminals (i.e. the corresponding bit line) is coupled to the current sink which may induce a sink voltage onto each drain terminal. This sink voltage may be 0.3V. Therefore, as illustrated by the example of FIG. 3, for a split gate memory cell being programmed during a program operation (and thus in the SR SC position), the voltage applied to the control gate is greater than the voltage applied to the select gate and greater than the voltage applied to the source terminal. Also, note that the voltage applied to the select gate of memory cell coupled to a selected row (and thus in the SR SC or SR UC position), the voltage applied to the select gate is greater than the voltage applied to the select gate of a memory cell that is coupled to an unselected row (and thus in the UR SC or UR UC position). Also, the voltage applied to the source terminal is greater than the voltage applied to the select gate of a memory cell in the SR SC or SR UC position.

During the programming of selected memory cell 26, the select gate of any memory cell in sector 0 not coupled to WL00 is set to a select gate bias voltage which reduces the band to band carrier generation. In one embodiment, this select gate bias voltage is greater than a voltage applied to the select gates of deselected memory cells during a read operation (which may be referred to as VSGread_deselected). In the current example, 0V (or ground) is provided to the select gates of deselected memory cells during a read operation, but 0.2V is provided to the select gates of the memory cells not coupled to WL00. Therefore, the select gate bias voltage of 0.2V is greater than the voltage applied to the select gates of the deselected memory cells during the read operation. Furthermore, in one embodiment, the select gate bias voltage applied to the memory cells not coupled to the selected row is less than or equal to the bit line voltage of a selected bit line plus the threshold voltage of the memory cells ("VBL+Vt"). Therefore, referring to the example of FIGS. 2 and 3, the threshold voltage may be 0.5V, and note that 0.2V is less than or equal to "0.3V+0.5V." That is, the select gate bias voltage may be less than a threshold voltage (Vt) of the memory cell above the voltage on the drain terminal (which corresponds to VBL). By applying this select gate bias to any memory cell not coupled to the selected word line, the band to band leakage current in these memory cells is reduced. Note that with increasing values of this select gate bias voltage from a value equal to VSGread_deselected to at most "VBL+Vt", the band to band carrier generation decreases. Therefore, although a select gate bias voltage that is greater than VSGread_deselected may increase source to drain leakage current, overall program disturb is reduced due to the reduction in the band to band carrier generation which is the dominant source of the program disturb.

Still referring to FIG. 3, note that the same select gate bias voltage applied during programming to the memory cells of the selected sector which are not coupled to the selected word line can be applied to the select gates of all memory cells in unselected sectors. Also, for the unselected sectors, voltages are applied to the control gates and source terminals to ensure that the memory cells remain off. Therefore, in the illustrated embodiment of FIG. 3, 1.5V is applied to the control gates (CG1) of any memory cell in the unselected sectors (e.g. memory cells 34 and 36). In one embodiment, the same value applied to the select gates of the memory cells (e.g. SG) in the unselected sectors is also applied to the source terminal (SRC1) of any memory cell in the unselected sectors.

Figure 4:
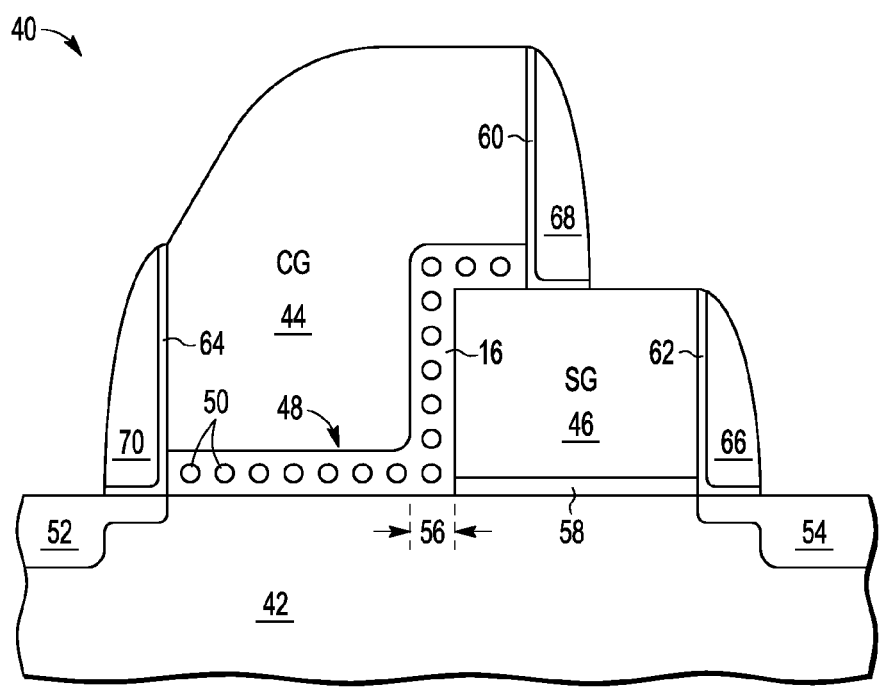
FIG. 4 illustrates a cross-sectional view of a split gate device of a bit cell of the memory array of FIG. 1 in accordance with one embodiment of the present disclosure.

FIG. 4 illustrates an example of a split gate memory cell 40 which may be used for the memory cells of array 20. Memory cell 40 includes a substrate 42 having source/drain regions 52 and 54, a select gate dielectric 58 over a first portion of substrate 42 between source/drain regions 52 and 54, a select gate 46 over select gate dielectric 58, a charge storage layer 48 over a second portion of substrate 42 between source/drain regions 52 and 54 (and adjacent the first portion of substrate 42) and which overlaps a sidewall of select gate 46, and a control gate 44 over charge storage layer 48. Memory cell 40 also includes a liner 60 and spacer 68 adjacent a first sidewall of CG 44 over SG 46, a liner 62 and spacer 66 adjacent a sidewall of SG 46 over source/drain region 54, and a liner 64 and spacer 70 adjacent a second sidewall of CG 44 over source/drain region 52. Charge storage layer may include a plurality of nanocrystals 50 surrounded by an insulating material. Note that the space between adjacent sidewalls of control gate 44 and select gate 46, in which charge storage layer 48 is located, results in a gap region 56 in substrate 42. When memory cell 40 is in an unselected row during a program operation, a voltage greater than the voltage applied to select gate 46 when memory cell 40 is deselected during a read operation and less than VBL+Vt is applied to select gate 46.

Note that it is the electric field formed at gap region 56 which affects program disturb of an unselected memory cell during a program operation. The electric field over this gap region causes band bending which results in the generation of electron/hole pairs. For example, when memory cell 40 is not selected for a program operation, the electric field over gap region 56 is determined by the difference in voltage between the source terminal voltage (e.g. SRC0, which is applied to source/drain region 52) and the select gate voltage (e.g. SG, which is applied to select gate 46), and by the difference in voltage between the control gate terminal voltage and the select gate voltage. By increasing the select gate voltage from the voltage which it receives when it is unselected during a read operation (e.g. 0V) to 0.2V during a program operation in which memory cell 40 is not selected, the electric field over band gap region 56 may be reduced. In this manner, band to band carrier generation is reduced such that fewer electron/hole pairs are generated during the program operation as compared to applying the lower voltage. Therefore, by applying a select gate voltage that is greater than the voltage applied when unselected during a read operation but less than or equal to the bit line voltage (the voltage on source/drain region 54) plus the threshold voltage of memory cell 40, reduced program disturb may be achieved. Furthermore, note that the stresses applied to non selected memory cells (such as those in the UR SC, UR UC, or SR UC position) receive the stresses from programming operations during more memory cycles as compared to the selected memory cell (in the SR SC position). The non selected memory cells in the UR UC position receive the most stress from programming, followed by those in the UR SC position. Therefore, by reducing band to band carrier generation in these non selected memory cells during programming operations, a greater impact on overall program disturb may be achieved.

By now it should be understood that there has been provided a method for programming a split gate memory cell within a split gate NVM with reduced program disturb. For example, by applying a voltage to the select gate of any memory cell that is coupled to an unselected row that is greater than the voltage applied to the select gate when unselected during a read operation but less than or equal to a threshold voltage greater than the voltage on the drain terminal, reduced band to band carrier generation may be achieved for those memory cells coupled to an unselected row. Furthermore, although the voltage applied to the select gate of memory cells coupled to an unselected row may result in increased source to drain leakage, due to the dominance of band to band generation leakage in program disturb and the greater number of cycles during which stress is applied to memory cells of unselected rows as compared to the memory cells of selected rows, overall program disturb of erased bits of the split gate NVM memory is reduced.

The semiconductor substrate described herein can be any semiconductor material or combinations of materials, such as gallium arsenide, silicon germanium, silicon-on-insulator (SOI), silicon, monocrystalline silicon, the like, and combinations of the above.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, different split gate configurations may be used to implement each memory cell. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of selective programming in a split gate memory having a first sector of split gate memory cells arranged in rows and columns, wherein each split gate memory cell has a control gate, a select gate coupled to a word line along one of the rows, a drain terminal coupled to a bit line along one of the columns, and a source terminal. The method of selective programming includes, for a split gate memory cell selected for programming by being coupled to a selected row and a selected column, coupling the control gate to a first voltage, coupling the select gate to a second voltage, coupling the drain terminal to a current sink that causes the split gate memory cell to be conductive, and coupling the source terminal to a third voltage; and, for split gate memory cells split gate cells not being programmed by being coupled to a deselected row, coupling the control gate to the first voltage, coupling the select gate to a fourth voltage which is greater than a voltage applied to the select gate during a read in which the split gate memory cells are deselected. Item 2 includes the method of item 1 and further includes, for split gate memory cells not being programmed by being coupled to a deselected column and a selected word line, coupling the control gate to the first voltage, coupling the select gate to the second voltage, coupling the drain terminal to a fifth voltage greater than the fourth voltage, and coupling the source terminal to the third voltage. Item 3 includes the method of item 2 and further includes, for the split gate memory cells not being programmed by being coupled to a deselected row and further characterized as being coupled to a deselected column, coupling the drain terminal to the fifth voltage. Item 4 includes the method of item 3, and further includes, for the split gate memory cells not being programmed by being coupled to a deselected row further characterized as being coupled to a selected column, coupling the drain terminal to the current sink. Item 5 include the method of item 4, wherein the split gate memory further comprises a second sector adjacent to the first sector arranged in rows and columns, wherein each split gate memory cell of the second sector has a control gate, a select gate coupled to a word line along one of the rows, a drain terminal coupled to one of the bit lines extending from the first sector and along the columns, and a source terminal, and further includes, for a split gate memory cell of the second sector that is deselected by the second sector being deselected and the column is selected, coupling the control gate to a sixth voltage, coupling the select gate to the fourth voltage, coupling the drain terminal to the current sink, and coupling the source terminal to the fourth voltage. Item 6 includes the method of item 5, and further includes, for a split gate memory cell of the second sector that is deselected by the second sector being deselected and the column being deselected, coupling the control gate to a sixth voltage, coupling the select gate to the fourth voltage, coupling the drain terminal to the sixth voltage, and coupling the source terminal to the fourth voltage. Item 7 includes the method of item 1, wherein the coupling the select gate to a fourth voltage for when the split gate memory cells are not being programmed is further characterized by the split gate memory cells having a threshold voltage and the fourth voltage being less than the threshold voltage above a voltage on the drain terminal. Item 8 includes the method of item 1, wherein the coupling the select gate to a fourth voltage for when the split gate memory cells are not being programmed is further characterized by the fourth voltage being greater than ground. Item 9 includes the method of item 8, wherein the first voltage is greater than the second voltage and the third voltage, the second voltage is greater than the fourth voltage, and the third voltage is greater than the second voltage. Item 10 includes the method of item 1, wherein the drain terminal of each split gate memory cell functions as a drain when being read and a source when being programmed and the source terminal functions as a source when being a read and a drain when being programmed.

Item 11 includes a split gate memory which includes a first sector of split gate memory cells arranged in rows and columns, wherein each split gate memory cell has a control gate, a select gate coupled to a word line along one of the rows, a drain terminal coupled to a bit line along one of the columns, and a source terminal; and programming circuitry for programming by which: for a split gate memory cell selected for programming by being coupled to a selected row and a selected column, coupling the control gate to a first voltage, coupling the select gate to a second voltage; coupling the drain terminal to a current sink that causes the split gate memory cell to be conductive, and coupling the source terminal to a third voltage, and for split gate memory cells not being programmed by being coupled to a deselected row, coupling the control gate to the first voltage, coupling the select gate to a fourth voltage which is greater than a voltage applied, during a read, to the select gates of the split gate memory cells that are deselected. Item 12 includes the split gate memory of item 11, wherein the programming circuitry is further characterized by coupling a fifth voltage to the drain terminals of split gate memory cells that are deselected by being coupled to a deselected column, wherein the fourth voltage is less than the fifth voltage. Item 13 includes the split gate memory of item 11, wherein the programming circuitry is further characterized by the current sink inducing a sink voltage on the source terminals to which the current sink is coupled, wherein the sink voltage is greater than the fourth voltage. Item 14 includes the split gate memory of item 11, wherein the programming circuitry is further characterized by the voltage applied, during a read, to the select gates of the split gate memory cells that are deselected being ground. Item 15 includes the split gate memory of item 11, and further includes a second sector of split gate memory cells arranged in rows and columns, wherein each split gate memory cell has a control gate, a select gate coupled to a word line along one of the rows, a drain terminal coupled to a bit line along one of the columns, and a source terminal; and the programming circuitry is further characterized by coupling the fourth voltage to the select gates of the split gate memory cells of the second sector when the second sector is deselected during programming of the first sector of split gate memory cells.

Item 16 includes a method for selectively programming a split gate memory, including providing a first sector of split gate memory cells arranged in rows and columns, wherein each split gate memory cell has a control gate, a select gate coupled to a word line along one of the rows, a drain terminal coupled to a bit line along one of the columns, and a source terminal; selecting a column and a row to identify a selected split gate memory cell to be programmed and to identify deselected split gate memory cells not on both a selected row and selected column, to the selected split gate memory cell, coupling a first voltage to the control gate, coupling a second voltage to the select gate, coupling a current sink to the drain terminal, and coupling a third voltage to the source terminal; and to each of the deselected split gate memory cells not on a selected row, coupling a fourth voltage to the select gate, wherein the fourth voltage is greater than ground and less than the second voltage. Item 17 includes the method of item 16 and further includes, to each of the split gate memory cells not on a selected row and not on a selected column, coupling a fifth voltage to the drain terminal, wherein the fifth voltage is greater than the fourth voltage. Item 18 includes the method of item 16 and further includes, to each of the split gate memory cells not on a selected row but on a selected column, coupling the current sink to the drain terminal. Item 19 includes the method of item 18, wherein the current sink causes sink voltage on the drain terminals to which the current sink is coupled, wherein the sink voltage is greater than the fourth voltage. Item 20 includes the method of item 16, wherein the coupling the fourth voltage to the select gate is further characterized by being less than the third voltage whereby the source terminal functions as a drain and the drain terminal functions as a source during programming.

What is claimed is:

1. In a split gate memory having a first sector of split gate memory cells arranged in rows and columns, wherein each split gate memory cell has a control gate, a select gate coupled to a word line along one of the rows, a drain terminal coupled to a bit line along one of the columns, and a source terminal, a method of selective programming, comprising:
for a split gate memory cell selected for programming by being coupled to a selected row and a selected column, coupling the control gate to a first voltage, coupling the select gate to a second voltage, coupling the drain terminal to a current sink that causes the split gate memory cell to be conductive, and coupling the source terminal to a third voltage; and
for split gate memory cells split gate cells not being programmed by being coupled to a deselected row, coupling the control gate to the first voltage, coupling the select gate to a fourth voltage which is greater than a voltage applied to the select gate during a read in which the split gate memory cells are deselected.

2. The method of claim 1, further comprising:
for split gate memory cells not being programmed by being coupled to a deselected column and a selected word line, coupling the control gate to the first voltage, coupling the select gate to the second voltage, coupling the drain terminal to a fifth voltage greater than the fourth voltage, and coupling the source terminal to the third voltage.

3. The method of claim 2, further comprising:
for the split gate memory cells not being programmed by being coupled to a deselected row and further characterized as being coupled to a deselected column, coupling the drain terminal to the fifth voltage.

4. The method of claim 3, further comprising;
for the split gate memory cells not being programmed by being coupled to a deselected row further characterized as being coupled to a selected column, coupling the drain terminal to the current sink.

5. The method of claim 4, wherein the split gate memory further comprises a second sector adjacent to the first sector arranged in rows and columns, wherein each split gate memory cell of the second sector has a control gate, a select gate coupled to a word line along one of the rows, a drain terminal coupled to one of the bit lines extending from the first sector and along the columns, and a source terminal, further comprising:
for a split gate memory cell of the second sector that is deselected by the second sector being deselected and the column is selected, coupling the control gate to a sixth voltage, coupling the select gate to the fourth voltage, coupling the drain terminal to the current sink, and coupling the source terminal to the fourth voltage.

6. The method of claim 5, further comprising:
for a split gate memory cell of the second sector that is deselected by the second sector being deselected and the column being deselected, coupling the control gate to a sixth voltage, coupling the select gate to the fourth voltage, coupling the drain terminal to the sixth voltage, and coupling the source terminal to the fourth voltage.

7. The method of claim 1, wherein the coupling the select gate to a fourth voltage for when the split gate memory cells are not being programmed is further characterized by the split gate memory cells having a threshold voltage and the fourth voltage being less than the threshold voltage above a voltage on the drain terminal.

8. The method of claim 1, wherein the coupling the select gate to a fourth voltage for when the split gate memory cells are not being programmed is further characterized by the fourth voltage being greater than ground.

9. The method of claim 8, wherein the first voltage is greater than the second voltage and the third voltage, the second voltage is greater than the fourth voltage, and the third voltage is greater than the second voltage.

10. The method of claim 1, wherein the drain terminal of each split gate memory cell functions as a drain when being read and a source when being programmed and the source terminal functions as a source when being a read and a drain when being programmed.

11. A split gate memory, comprising:
a first sector of split gate memory cells arranged in rows and columns, wherein each split gate memory cell has a control gate, a select gate coupled to a word line along one of the rows, a drain terminal coupled to a bit line along one of the columns, and a source terminal; and
programming circuitry for programming by which:
for a split gate memory cell selected for programming by being coupled to a selected row and a selected column, coupling the control gate to a first voltage, coupling the select gate to a second voltage; coupling the drain terminal to a current sink that causes the split gate memory cell to be conductive, and coupling the source terminal to a third voltage, and
for split gate memory cells not being programmed by being coupled to a deselected row, coupling the control gate to the first voltage, coupling the select gate to a fourth voltage which is greater than a voltage applied, during a read, to the select gates of the split gate memory cells that are deselected.

12. The split gate memory of claim 11, wherein the programming circuitry is further characterized by coupling a fifth voltage to the drain terminals of split gate memory cells that are deselected by being coupled to a deselected column, wherein the fourth voltage is less than the fifth voltage.

13. The split gate memory of claim 11, wherein the programming circuitry is further characterized by the current sink inducing a sink voltage on the source terminals to which the current sink is coupled, wherein the sink voltage is greater than the fourth voltage.

14. The split gate memory of claim 11, wherein the programming circuitry is further characterized by the voltage applied, during a read, to the select gates of the split gate memory cells that are deselected being ground.

15. The split gate memory of claim 11 further comprising:
a second sector of split gate memory cells arranged in rows and columns, wherein each split gate memory cell has a control gate, a select gate coupled to a word line along one of the rows, a drain terminal coupled to a bit line along one of the columns, and a source terminal; and
the programming circuitry is further characterized by coupling the fourth voltage to the select gates of the split gate memory cells of the second sector when the second sector is deselected during programming of the first sector of split gate memory cells.

16. A method for selectively programming a split gate memory, comprising:
providing a first sector of split gate memory cells arranged in rows and columns, wherein each split gate memory cell has a control gate, a select gate coupled to a word line along one of the rows, a drain terminal coupled to a bit line along one of the columns, and a source terminal;
selecting a column and a row to identify a selected split gate memory cell to be programmed and to identify deselected split gate memory cells not on both a selected row and selected column,
to the selected split gate memory cell, coupling a first voltage to the control gate, coupling a second voltage to the select gate, coupling a current sink to the drain terminal, and coupling a third voltage to the source terminal; and
to each of the deselected split gate memory cells not on a selected row, coupling a fourth voltage to the select gate, wherein the fourth voltage is greater than ground and less than the second voltage.

17. The method of claim 16, further comprising, to each of the split gate memory cells not on a selected row and not on a selected column, coupling a fifth voltage to the drain terminal, wherein the fifth voltage is greater than the fourth voltage.

18. The method of claim 16, further comprising, to each of the split gate memory cells not on a selected row but on a selected column, coupling the current sink to the drain terminal.

19. The method of claim 18, wherein the current sink causes sink voltage on the drain terminals to which the current sink is coupled, wherein the sink voltage is greater than the fourth voltage.

20. The method of claim 16, wherein the coupling the fourth voltage to the select gate is further characterized by being less than the third voltage whereby the source terminal functions as a drain and the drain terminal functions as a source during programming.

* * * * *